United States Patent [19]

Blumenau

[11] Patent Number: 5,602,490
[45] Date of Patent: Feb. 11, 1997

[54] CONNECTOR FOR AUTOMATIC TEST EQUIPMENT

[75] Inventor: Steven M. Blumenau, Royalston, Mass.

[73] Assignee: GenRad, Inc., Concord, Mass.

[21] Appl. No.: 403,472

[22] Filed: Mar. 14, 1995

[51] Int. Cl.$^6$ ............................. B23P 21/00; G01R 1/06; G01R 31/02
[52] U.S. Cl. ................. 324/754; 29/705; 439/66
[58] Field of Search ................... 324/754, 73.1; 29/832, 407, 846, 407, 825, 705, 884; 439/67, 66; 228/123, 129

[56] References Cited

U.S. PATENT DOCUMENTS

| | | | |
|---|---|---|---|
| 5,012,187 | 4/1991 | Littlebury | 324/754 |
| 5,020,219 | 6/1991 | Leedy | 29/846 |
| 5,034,685 | 6/1991 | Leedy | 324/754 |
| 5,103,557 | 4/1992 | Leedy | 29/832 |
| 5,109,596 | 5/1992 | Driller et al. | 29/705 |
| 5,397,997 | 3/1995 | Tuckerman et al. | 324/754 |

Primary Examiner—Kenneth A. Wieder
Assistant Examiner—Barry C. Bowser
Attorney, Agent, or Firm—Cesari and McKenna

[57] ABSTRACT

A connector, for use with an automatic test system for testing integrated circuit boards, consists of a non-conductive carrier that supports a plurality of electrically conductive contacts. In a preferred embodiment, the carrier includes a plurality of holes, each of which is filled with a wire mesh. The wire mesh compresses as necessary to accommodate variations in the lengths of the leads of the device-under-test or the wires of a system component, such as the system fixture. In an alternative embodiment, a flexible carrier supports a plurality of wires. The wires may be embedded in the carrier, or they may be wrapped partially around the carrier, to electrically connect leads proximate to top of the carrier with leads or contacts proximate to the bottom of the carrier. In a second alternative embodiment, the connector consists of a plurality of conductive drops, that are strategically placed on the ends of wires, leads or contacts. The drops are applied to the leads, wire and contacts in a semi-fluid state and they then harden. The drops are preferably made of a material such as a conductive polymer or a conductive silicon rubber, which remains somewhat elastic after it hardens. The drops may be supported by a carrier, instead of applied directly to the leads, wires or contacts.

26 Claims, 4 Drawing Sheets

CONNECTOR FOR AUTOMATIC TEST EQUIPMENT

FIELD OF THE INVENTION

This invention relates generally to automatic test equipment for testing integrated circuit boards, and more particularly, to connectors for electrically interconnecting the circuit boards and the test equipment.

BACKGROUND OF THE INVENTION

Integrated circuit boards are typically tested after assembly to ensure that the boards work properly. The tests consist of subjecting selected components or selected component leads to predetermined signals or series of signals and examining the responses of the components individually and as an interconnected functional group.

To perform the tests, the selected components and leads are electrically connected to a tester, which is part of an automatic test system. As depicted in FIG. 1, the automatic test system 10 includes the tester 12 and a tester receiver 14 that provides contacts 13 through which signals produced by the tester 12 are applied, via a fixture 16, to selected leads 17a and test pads 17b of the components 19 on a circuit board 18. The components 19 and the circuit board 18 are together referred to herein as a device-under-test (DUT) 20. The leads 17a and the test pads 17b are referred to collectively herein as leads 17.

The fixture 16 may include, for example, internal wires 15 that are used to connect the leads 17 to particular ones of the tester receiver's contacts 13. The fixture utilizes a bottom plate 16a to make the actual connections with the contacts 13 of the tester receiver. The bottom plate supports a plurality of "nails" 16b that connect by wire wrap or other means to the internal wires 15. The nails 16b are the contacts through which signals that pass through the fixture are applied to and received from the tester receiver 14.

The fixture 16 must be held in electrical contact with both the tester receiver 14 and the DUT 20, such that all signal connections are properly made. In prior known systems, both the tester receiver 14 and the fixture 16 include a set of conventional spring probes 22, which make the physical connections. The probes 22, individually, are relatively expensive. Accordingly, the fixture 16 and the tester receiver 14, which each include thousands of these spring probes, are costly.

The spring probes 22 are included in the fixture 16 to accommodate the varying lengths of the DUT leads 17, in particular, those leads that extend through the circuit board 18. The spring probes 22 in both the fixture 16 and the receiver 14 also accommodate any bending or warping of the DUT 20 and/or the fixture 16 in response to the relatively large applied force that holds the system components in electrical contact, as discussed below. Further, the spring probes 22 wipe, or clean, the ends of the nails 16b and the DUT leads 17.

The force applied to the various components of the system 10 to bring these components into electrical, and thus, physical, contact must be large enough to activate the springs on the thousands of probes 22. This force must also be applied essentially evenly across the DUT 20 and the fixture 16, to activate all of the springs necessary to make the appropriate connections. Typically, a vacuum or a mechanical force of approximately 4 pounds per square inch is required. The machinery to produce such a force is expensive to acquire and to operate. Further, special care must be taken in applying the force, to avoid excessive warping or bending of the system components.

What is needed is a connection mechanism that is less expensive and requires less applied force per square inch. This connection mechanism must accommodate the variations in the lengths of the DUT leads and any bending or warping of the DUT and the fixture.

SUMMARY OF THE INVENTION

The invention is a connector for use between a fixture and a tester receiver and, also, between a device-under-test (DUT) and the fixture. The connector consists of a nonconductive carrier that supports or has embedded therein a plurality of electrically conductive contacts. Either or both of the carrier and the contacts are flexible, to accommodate the varying lengths of DUT leads, and/or the bending or warping of the DUT or fixture in response to an applied force. The force required to hold the various system components in electrical contact via the connectors is approximately one pound per square inch, which is significantly less than the force required with prior known test systems.

Specifically, in a preferred embodiment a hard plastic nonconductive carrier includes an array of holes, each of which is filled with an electrically conductive wire mesh. The wire mesh compresses as necessary to accommodate variations in the lengths of DUT leads or the warping or bending of the fixture. This connector, which is significantly less expensive than the arrays of spring probes used in prior known test systems, can be used to electrically connect the DUT to the fixture, and the fixture to the tester receiver.

In an alternative embodiment the carrier is made of an elastomer, which is somewhat flexible. The elastomer supports an array of wires that are either embedded therein or are wrapped partially around the outside, making connections from a top surface of the elastomer to a bottom surface. The wrapped wires are preferably arranged in a pattern that corresponds to the pattern of the fixture nails.

In a second alternative embodiment, the connector consists of a plurality of strategically placed drops of a highly-conductive material. The material, which is applied to the system components in a semi-fluid state, includes a high density of conductive particles suspended therein. The material hardens to form contacts for electrical connection, and yet remains somewhat elastic, such that each contact compresses as necessary to accommodate variations in the lengths of the DUT leads or a bending or warping of the fixture.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
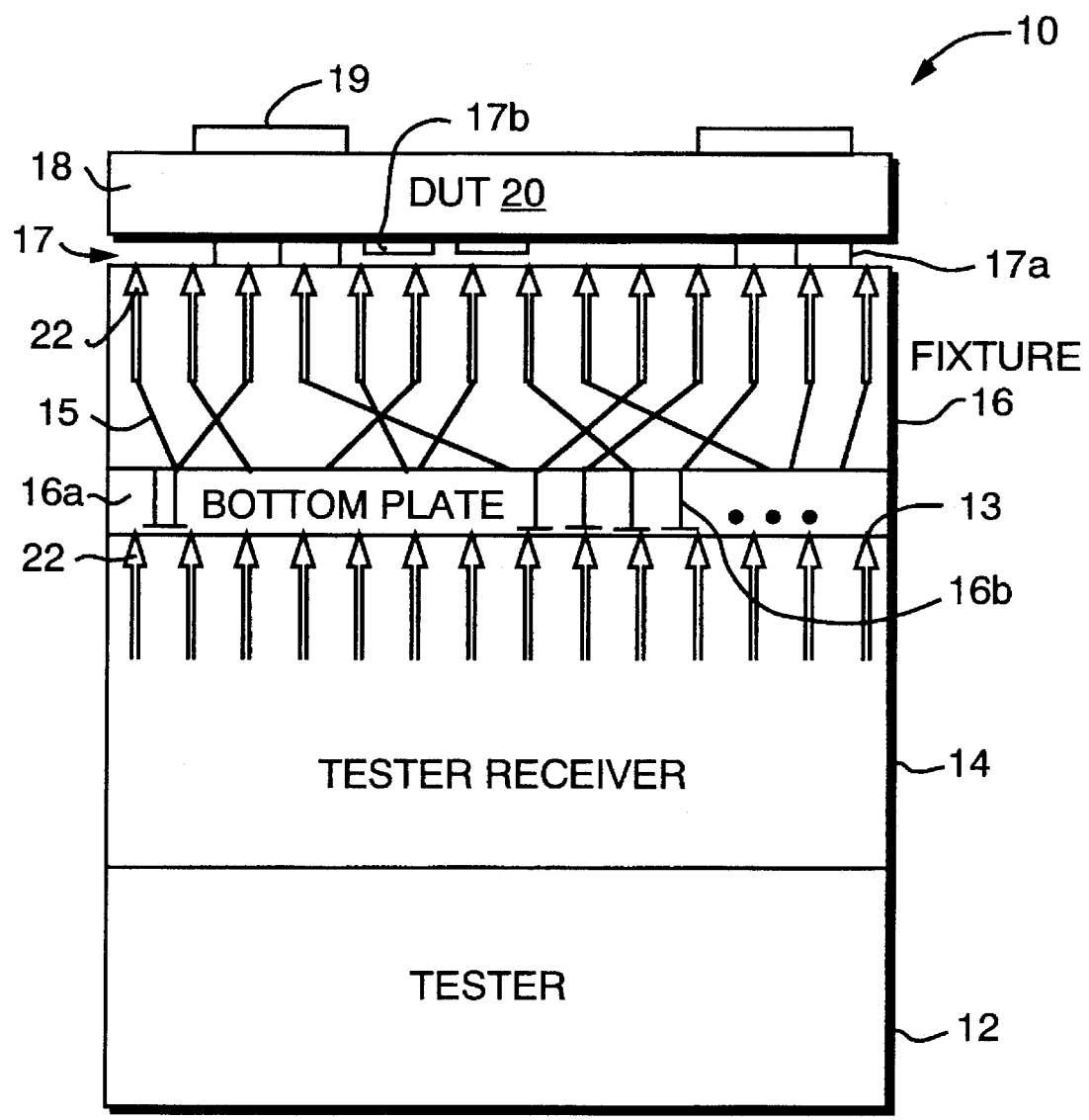
FIG. 1 is a functional block diagram of an automatic test system constructed in accordance with the prior art.
Figure 2:
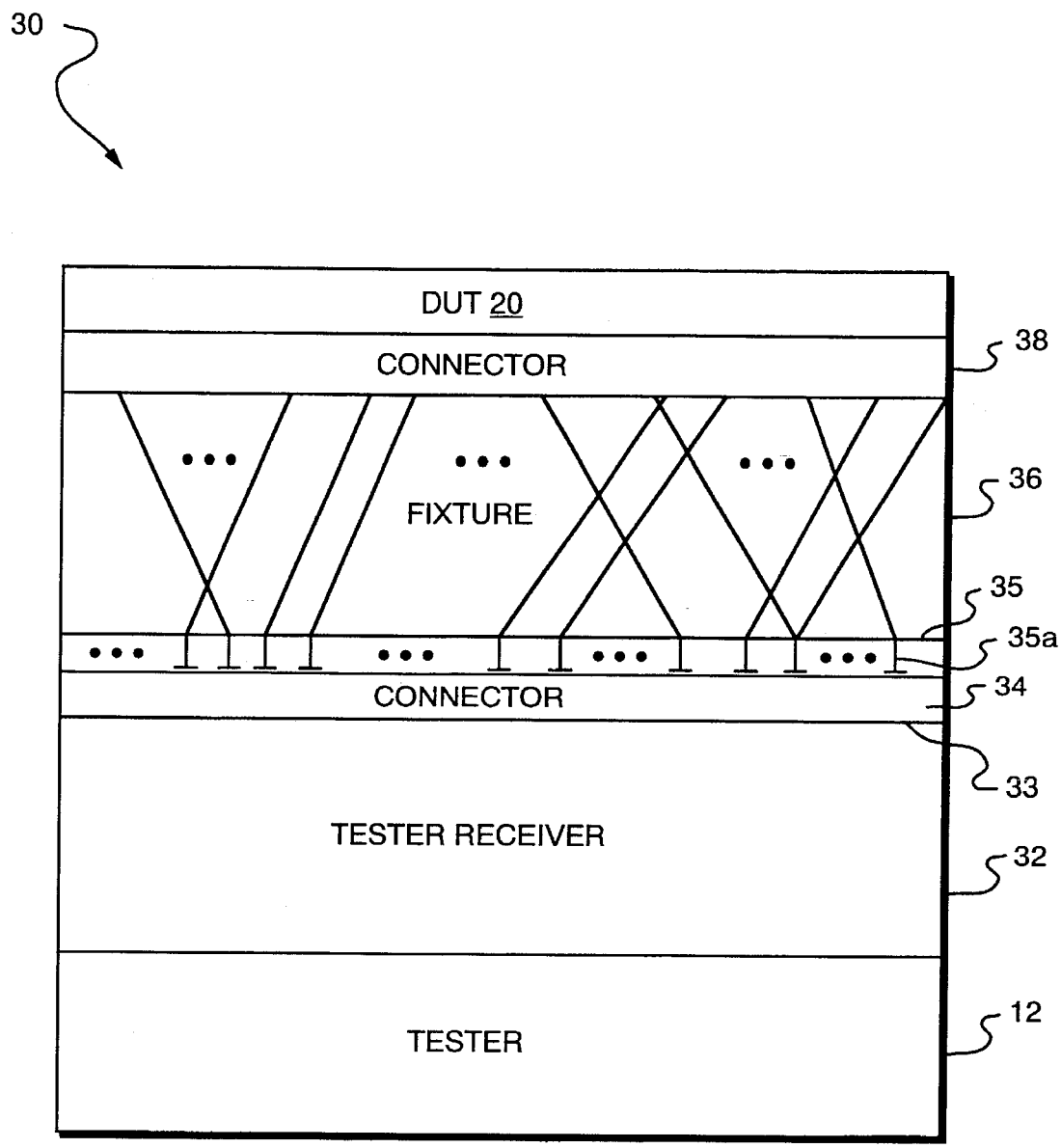
FIG. 2 is a functional block diagram of an automatic test system constructed in accordance with the invention.

Referring now to FIG. 2 an automatic test system 30 includes a tester receiver 32 and a fixture 36 interconnected by a first connector 34. A second connector 38 interconnects the fixture 36 and the device-under-test (DUT) 20. As discussed in more detail below with reference to FIG. 3, the connectors 34 and 38 eliminate from the tester receiver 32 and the fixture 36 the spring probes 22 (FIG. 1). The connectors 34 and 38 may be made of the same materials and of the same design or they may be made of different materials and/or a different designs, depending on the method of testing performed by the system 30.

Figure 3:
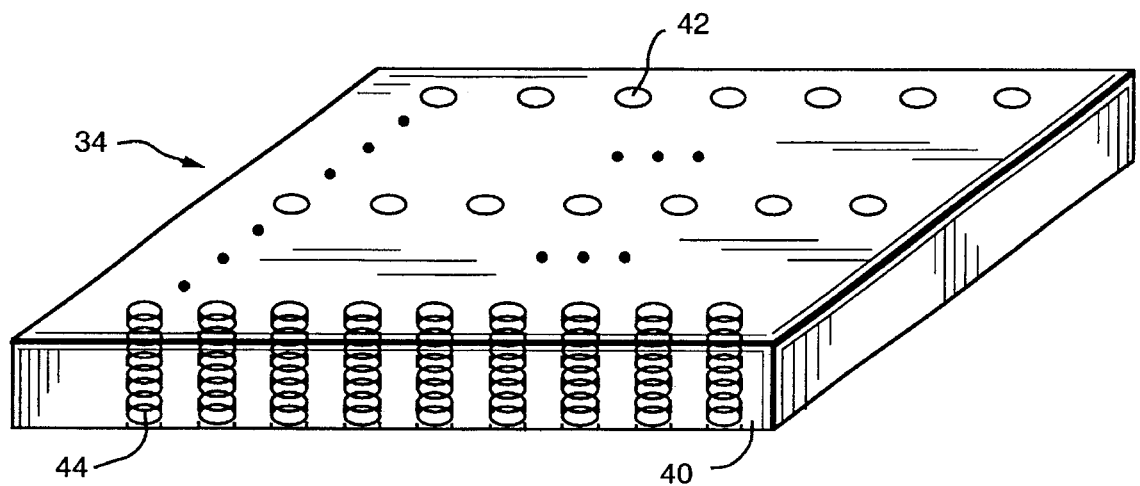
FIG. 3 depicts in more detail a connector of FIG. 2.

Referring now also to FIG. 3, the connector 34 consists of a non-conductive carrier 40 with strategically placed holes 42. The holes 42 run through the carrier 40 and are each filled with electrically conductive wire mesh 44. The wire mesh 44 connects nails 35a in the fixture bottom plate 35 to contacts 33 on the tester receiver 34. The non-conductive carrier 40 electrically isolates these connections, such that there is no side-to-side conduction.

Preferably, the carrier 40 is made of a hard plastic that is easily drilled. The wire mesh 44 that fills the drilled holes compresses, as necessary, to accommodate any bending of the fixture 36 that may result when a force is applied to interconnect the various system components. The wire mesh 44 also tends to wipe, or clean, the leads 35 and the contacts 33 when the various system components are brought into contact.

The holes 42 are strategically placed to provide the desired connections. They may be closely and regularly spaced such that each fixture nail 35a necessarily connects with the wire mesh 44 in one of the holes 42, regardless of the pattern of the nails. Alternatively, the holes 42 may be strategically located to conform to the pattern of the fixture nails 35a. This type of connector may also used to interconnect the DUT 20 and the fixture 36, i.e., used as the connector 38. Thus, the holes 42 of the connector 38 may be closely and regularly spaced, as discussed, or they may be arranged in a pattern that matches the pattern of the selected leads 17.

A vacuum or mechanical force of approximately one pound per square inch is applied to the system components to hold them in electrical contact via the connectors 34 and 38. This force is significantly less than the four pounds per square inch that is required with prior known test systems. Accordingly, the fixture 36 and the DUT 20 will not tend to bend or warp as much as the fixtures of the prior known systems.

Figure 4:
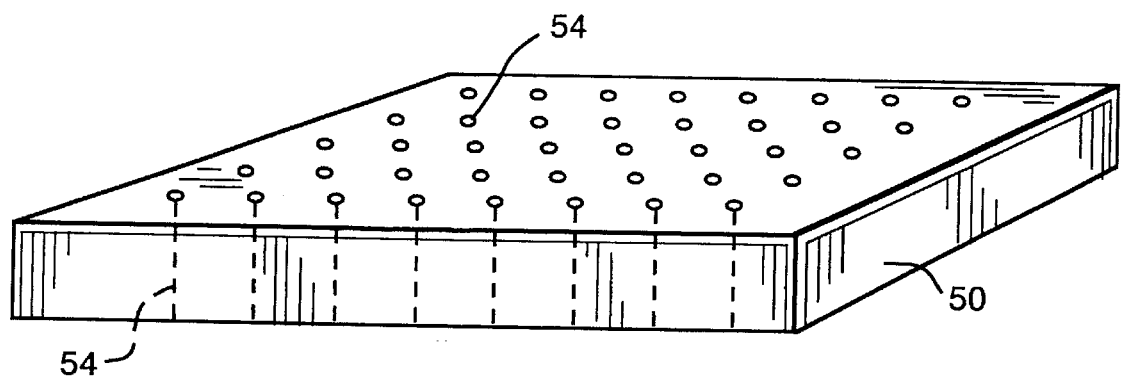
FIG. 4 depicts an alternative embodiment of the connector of FIG. 3 that includes a carrier and a plurality of connector wires.

Referring now to FIG. 4, an alternative embodiment of the connector 34 or 38 is depicted. This embodiment includes a carrier 50 made of an elastomer and a plurality of embedded connector wires 54 that make top-to-bottom connections through the carrier. The carrier 50 and the wires 54 are each somewhat flexible and compress, as necessary, to accommodate any bending or warping of the fixture 36.

This type of connector may also be used to interconnect the fixture 36 and the DUT 20. Since many of the DUT components 19 (FIG. 1) are today surface mounted on the circuit board 18, there is little variation in the lengths of the most of the leads 17.

Figure 5:
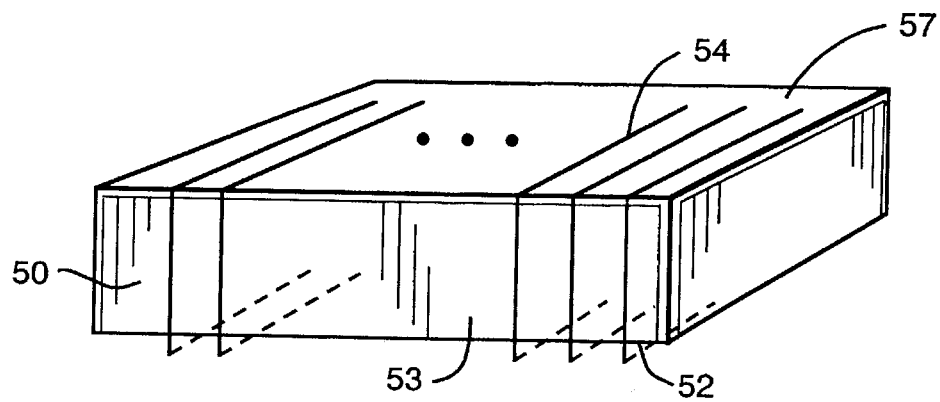
FIG. 5 depicts an alternative view of the connector of FIG. 4.
Figure 6:
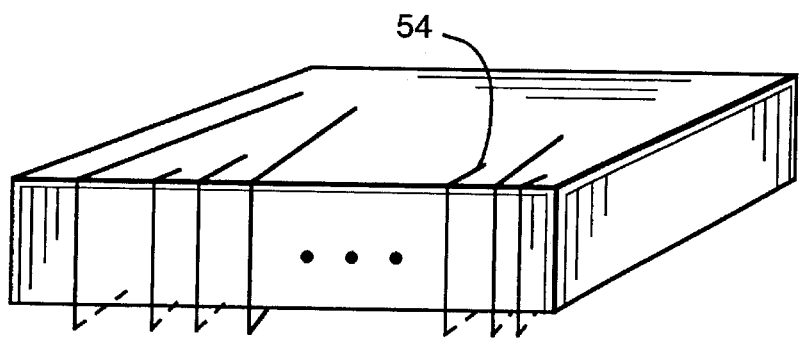
FIG. 6 depicts an alternative arrangement of the carrier and connector wires of FIG. 4.

FIG. 5 depicts the carrier 50 with an alternative arrangement of the connector wires 54. The wires 54 are wrapped essentially around the top 51, bottom 52 and one side 53 of the carrier 50, to make top-to-bottom connections. These wrapped wires 54 may connect multiple fixture wires 35 to one or more tester receiver contacts 33. Alternatively, the connector wires 54 may be of various lengths, as depicted in FIG. 6, or used in sets of very thin lengths, to connect selected fixture nails 35a to particular contacts 33.

This embodiment of the connector is preferably used in test systems that apply the same signal or series of signals simultaneously to a plurality of the leads 17. It is also preferably used with systems that test relatively few leads 17.

Figure 7:
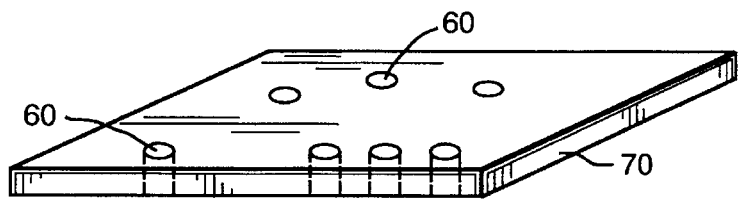
FIG. 7 depicts a second alternative embodiment of the connector of FIG. 3.

Referring now to FIG. 7, a second alternative embodiment of the connector 34 or 38 consists of a plurality of hardened, highly conductive drops 60. The drops 60 are strategically placed directly on the ends of selected fixture nails 35a and/or contacts 33 of the tester receiver 34. Alternatively, the drops may fill holes in a carrier 70.

The drops 60 are placed in the desired locations when the material is in a semi-fluid state, with highly conductive particles suspended therein. The material then hardens in place, while also retaining an elasticity that allows it to compress, as necessary, to accommodate variations in the length of the leads 17, the bending of the DUT 20 and/or the bending of the fixture 36. Alternatively, a sheet formed from the hardened conductive material may be cut into drop-sized pieces and the pieces strategically positioned on the system components. Examples of such a material are a conductive silicon rubber and a conductive polymer.

In summary, the cost of the system 30 with connectors 34 and 38 is significantly lower than the cost of prior known systems, which include in the fixture and the tester receiver pluralities of spring probes. Further, the cost of operating the test system 30 is significantly less than the cost of operating the prior known system, since the force required to hold the system components in electrical contact is many times less than the force required with the prior known systems. Another advantage of the system 30 is that the DUT 20 is not bent during testing. In prior known systems, the DUT 20 may be bent by the probes 22, which push into the board 18 under the large applied force required by such systems to bring the components thereof into electrical contact (FIG. 1).

The foregoing description has been limited to specific embodiments of this invention. It will be apparent, however, that variations and modifications may be made to the invention, with the attainment of some or all of its advantages. Therefore, it is the object of the appended claims to cover all such variations and modifications as come within the true spirit and scope of the invention.

I claim:

1. An automatic test system for testing integrated circuit boards, the test system including:

A. a tester, for supplying test signals for the integrated circuit board and analyzing signals produced by the integrated circuit board;

B. a tester receiver for supplying the test signals to contacts arranged in a predetermined pattern and receiving signals from the contacts;

C. a fixture for receiving test signals from the tester receiver and supplying the signals to the integrated circuit board, the fixture also receiving signals from the circuit board and supplying the signals to the tester receiver;

D. a first connector for supplying signals between the tester receiver and the fixture, the connector consisting of
  i. a non-conducting carrier with a top and a bottom, and
  ii. a plurality of resilient electrically conductive contacts for electrically interconnecting selected contacts of the tester receiver that is proximate to the top of the carrier to selected contacts of the fixture that is proximate to the bottom of the carrier, the electrically conductive contacts being supported by the carrier and compressing as necessary to accommodate variations in the fixture, the carrier electrically isolating the electrically conductive contacts from one another.

2. The automatic test system of claim 1 further including a second connector for supplying signals between the fixture and the integrated circuit board, the second connector consisting of
  i. a non-conducting carrier with a top and a bottom, and
  ii. a plurality of resilient electrically conductive contacts for electrically interconnecting selected contacts of the integrated circuit board that is proximate to the top of the carrier to selected contacts of the fixture that is proximate to the bottom of the carrier, the electrically conductive contacts being supported by the carrier and compressing as necessary to accommodate variations in the fixture and the integrated circuit board, the carrier electrically isolating the electrically conductive contacts from one another.

3. The automatic test system of claim 1, wherein the carrier includes a plurality of holes, each hole accepting an electrically conductive contact.

4. The automatic test system of claim 1, wherein electrically conductive contacts consist of a plurality of wires, each of the wires extending through a hole in the carrier to make a top-to-bottom connection through the carrier.

5. The automatic test system of claim 1, wherein the carrier is flexible, and flexes as necessary to accommodate variations in the system components.

6. The automatic test system of claim 3, wherein each of the electrically conductive contacts consist of a wire mesh, the wire mesh filling the holes and compressing as necessary to accommodate variations in the system components.

7. The automatic test system of claim 1, wherein the electrically conductive contacts consist of a plurality of wires that wrap partially around the carrier, the wires wrapping from the top of the carrier to the bottom of the carrier, around one side of the carrier.

8. The automatic test system of claim 1, wherein the electrically conductive contacts consist of drops of a material that has conductive particles suspended therein.

9. The automatic test system of claim 2, wherein the carrier includes a plurality of holes, each hole accepting an electrically conductive contact.

10. The automatic test system of claim 2, wherein electrically conductive contacts consist of a plurality of wires, each of the wires extending through a hole in the carrier to make a top-to-bottom connection through the carrier.

11. The automatic test system of claim 2, wherein the carrier is flexible, and flexes as necessary to accommodate variations in the system components.

12. The automatic test system of claim 9, wherein each of the electrically conductive contacts consist of a wire mesh, the wire mesh filling the holes and compressing as necessary to accommodate variations in the system components.

13. A connector for use with an automatic test system for testing integrated circuit boards, the connector including:
  A. a non-conducting carrier with a top and a bottom;
  B. a plurality of resilient electrically conductive contacts for electrically interconnecting selected leads, pads or contacts of a system component proximate to the top of the carrier with selected leads, pads or contacts of a system component proximate to the bottom of the carrier, the contacts being supported by the carrier and compressing as necessary to accommodate variations in the system components, the carrier electrically isolating the electrically conductive contacts from one another.

14. The connector of claim 13, wherein the carrier includes a plurality of holes, each hole accepting an electrically conductive contact.

15. The connector of claim 14, wherein electrically conductive contacts consist of a plurality of wires, each of the wires extending through a hole in the carrier to make a top-to-bottom connection through the carrier.

16. The connector of claim 13, wherein the carrier is flexible, and flexes as necessary to accommodate variations in the system components.

17. The connector of claim 14, wherein each of the electrically conductive contacts consist of a wire mesh, the wire mesh filling the holes and compressing as necessary to accommodate variations in the system components.

18. The connector of claim 13, wherein the electrically conductive contacts consist of a plurality of wires that wrap partially around the carrier, the wires wrapping from the top of the carrier to the bottom of the carrier, around one side of the carrier.

19. The connector of claim 13, wherein the electrically conductive contacts consist of drops of a material that has conductive particles suspended therein.

20. A connector for use with an automatic test system for testing integrated circuit boards, the connector including:
  A. a carrier with a top and a bottom, the carrier including a plurality of strategically placed holes that extend from the top to the bottom; and
  B. wire mesh for filling the holes to provide through each hole an electrical connection from the top of the carrier to the bottom of the carrier, the wire mesh being resilient and compressing as necessary to accommodate variations in the system components.

21. The connector of claim 20, wherein the carrier electrically isolates one hole from another.

22. A connector for use with an automatic test system for testing integrated circuit boards, the connector comprising a plurality of drops of a conductive material, the drops being strategically placed on wires, contacts or leads of components of the test system, to electrically connect the leads to selected leads, wires or contacts of another of the system components.

23. The connector of claim 22 wherein the drops are in a semi-fluid state when they are placed on the leads, wires or contacts.

24. The connector of claim 22 wherein the drops each include a concentration of highly conductive particles suspended therein.

25. The connector of claim 22, wherein the conductive material is a conductive polymer.

26. The connection of claim 22, wherein the conductive material is a conductive silicon rubber.

* * * * *